(12) United States Patent
Song et al.

(10) Patent No.: US 9,620,477 B2
(45) Date of Patent: Apr. 11, 2017

(54) WIRE BONDER AND METHOD OF CALIBRATING A WIRE BONDER

(71) Applicants: Keng Yew Song, Singapore (SG); Wai Wah Lee, Singapore (SG); Yi Bin Wang, Singapore (SG)

(72) Inventors: Keng Yew Song, Singapore (SG); Wai Wah Lee, Singapore (SG); Yi Bin Wang, Singapore (SG)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 61 days.

(21) Appl. No.: 14/162,336

(22) Filed: Jan. 23, 2014

(65) Prior Publication Data
US 2014/0209663 A1    Jul. 31, 2014

Related U.S. Application Data
(60) Provisional application No. 61/756,550, filed on Jan. 25, 2013.

(51) Int. Cl.
*B23K 31/02* (2006.01)
*H01L 23/00* (2006.01)
(52) U.S. Cl.
CPC .............. *H01L 24/78* (2013.01); *H01L 24/85* (2013.01); *H01L 24/48* (2013.01); *H01L 2224/48247* (2013.01); *H01L 2224/78268* (2013.01); *H01L 2224/78301* (2013.01); *H01L 2224/78801* (2013.01); *H01L 2224/859* (2013.01); *H01L 2224/85045* (2013.01); *H01L 2224/85205* (2013.01); *H01L 2924/00014* (2013.01); *H01L 2924/12042* (2013.01)

(58) Field of Classification Search
CPC .... B23K 20/005; B23K 20/004; B23K 20/10; B23K 20/007; B23K 20/106; B23K 2201/42
USPC ...................................... 228/180.5, 4.5, 904
See application file for complete search history.

(56) References Cited

U.S. PATENT DOCUMENTS 5,456,403 A * 10/1995 Nishimaki .............. H01L 24/78
                                                              228/102
6,070,778 A *  6/2000 Takahashi ............ B23K 20/004
                                                              228/102

* cited by examiner

*Primary Examiner* — Erin Saad
(74) *Attorney, Agent, or Firm* — Ostrolenk Faber LLP

(57) ABSTRACT

Disclosed is a wire bonder comprising: a processor; a bond head coupled to the processor, the processor being configured to control motion of the bond head; a bonding tool mounted to the bond head, the bonding tool being drivable by the bond head to form an electrical interconnection between a semiconductor die and a substrate to which the semiconductor die is mounted using a bonding wire; and a measuring device coupled to the bond head, the measuring device being operable to measure a deformation of a bonding portion of the bonding wire as the bonding tool is driven by the bond head to connect the bonding wire to the semiconductor die via the bonding portion. Specifically, the processor is configured to derive at least one correlation between the measured deformation of the bonding portion and an operating parameter of the wire bonder; compare the at least one derived correlation against a predetermined correlation between the operating parameter of the wire bonder and a desired deformation of the bonding portion; and calibrate the operating parameter of the wire bonder based on the comparison between the at least one derived correlation and the predetermined correlation of the deformation of the bonding portion against the operating parameter of the wire bonder. A method of calibrating a wire bonder is also disclosed.

9 Claims, 4 Drawing Sheets

WIRE BONDER AND METHOD OF CALIBRATING A WIRE BONDER

FIELD OF THE PRESENT INVENTION

This invention relates to a wire bonder and a method of calibrating the wire bonder.

BACKGROUND OF THE INVENTION

Wire bonders are conventionally used during semiconductor assembly and packaging for making electrical wire connections between electrical contact pads on a semiconductor chip and a substrate, or between electrical contact pads on different semiconductor chips. Specifically, a bonding wire is fed from a wire spool containing the bonding wire through a bonding tool, such as a capillary, for performing a wire bonding process. By using a combination of heat, pressure and ultrasonic energy, the bonding wire is bonded or welded to a connection pad of the semiconductor chip or the substrate. The wire bonding process is a solid phase welding process, wherein two metallic materials (i.e. the bonding wire and the connection pad surface) are brought into intimate contact. Once the surfaces are in intimate contact, electron sharing or interdiffusion of atoms takes place, resulting in the formation of a wire bond.

Calibration of wire bonders is required to ensure performance consistency across different wire bonders. At present, the calibration of wire bonders includes the following steps:
1) Using an external laser vibrometer or optical vibrometer to measure ultrasonic vibration of the wire bonder's transducer tip or capillary tip;
2) Recording bonding results such as ball size, ball shear, number of ball lift, bond pad peeling after wire pull, etc.; and
3) Using an external force sensor to calibrate the bond force based on the measured ultrasonic vibration and recorded bonding results.

The above method of calibrating wire bonders has the following shortcomings:
1) As the method takes a long time to measure the bonding results, for example the ball size and ball shear, a user normally derives these measurements based on a limited range of ultrasonic vibration of the wire bonder's transducer tip and this affects the calibration accuracy.
2) As the use of the external laser vibrometer or optical vibrometer involves other equipment for measuring the ultrasonic vibration of a wire bonder's transducer tip, a long setup time may be needed.
3) As the method does not simulate the actual operation of wire bonders, it may not be accurate.
4) As the external force sensor requires additional equipment to calibrate the wire bonder, calibration of wire bonders may take a long time.

SUMMARY OF THE INVENTION

A first aspect of the invention is a wire bonder comprising: i) a processor; ii) a bond head coupled to the processor, the processor being configured to control motion of the bond head; iii) a bonding tool mounted to the bond head, the bonding tool being drivable by the bond head to form an electrical interconnection between a semiconductor die and a substrate to which the semiconductor die is mounted using a bonding wire; and iv) a measuring device coupled to the bond head, the measuring device being operable to measure a deformation of a bonding portion of the bonding wire as the bonding tool is driven by the bond head to connect the bonding wire to the semiconductor die via the bonding portion. In particular, the processor is configured to: i) derive at least one correlation between the measured deformation of the bonding portion and an operating parameter of the wire bonder; ii) compare the at least one derived correlation against a predetermined correlation between the operating parameter of the wire bonder and a desired deformation of the bonding portion; and iii) calibrate the operating parameter of the wire bonder based on the comparison between the at least one derived correlation and the predetermined correlation of the deformation of the bonding portion against the operating parameter of the wire bonder.

A second aspect of the invention is a method of calibrating a wire bonder, the wire bonder comprising a processor, a bond head, a bonding tool drivable by the bond head to form an electrical interconnection between a semiconductor die and a substrate to which the semiconductor die is mounted using a bonding wire; and a measuring device operable to measure a deformation of a bonding portion that is formed at the bonding wire as the bonding tool is driven by the bond head to connect the bonding wire to the semiconductor die via the bonding portion. Specifically, the method comprises the steps of: deriving at least one correlation between the measured deformation of the bonding portion and an operating parameter of the wire bonder; comparing the at least one derived correlation against a predetermined correlation between the operating parameter of the wire bonder and a desired deformation of the bonding portion; and calibrating the operating parameter of the wire bonder based on the comparison between the at least one derived correlation and the predetermined correlation of the deformation of the bonding portion against the operating parameter of the wire bonder.

BRIEF DESCRIPTION OF THE DRAWINGS

Preferred embodiments of the invention will now be described, by way of example only, with reference to the accompanying drawings, of which:

FIG. 1a shows a wire bonder having a bonding tool for wire bonding, while FIG. 1b shows a schematic arrangement of the wire bonder of FIG. 1a;

DETAILED DESCRIPTION OF THE PREFERRED EMBODIMENTS

Figure 1A:
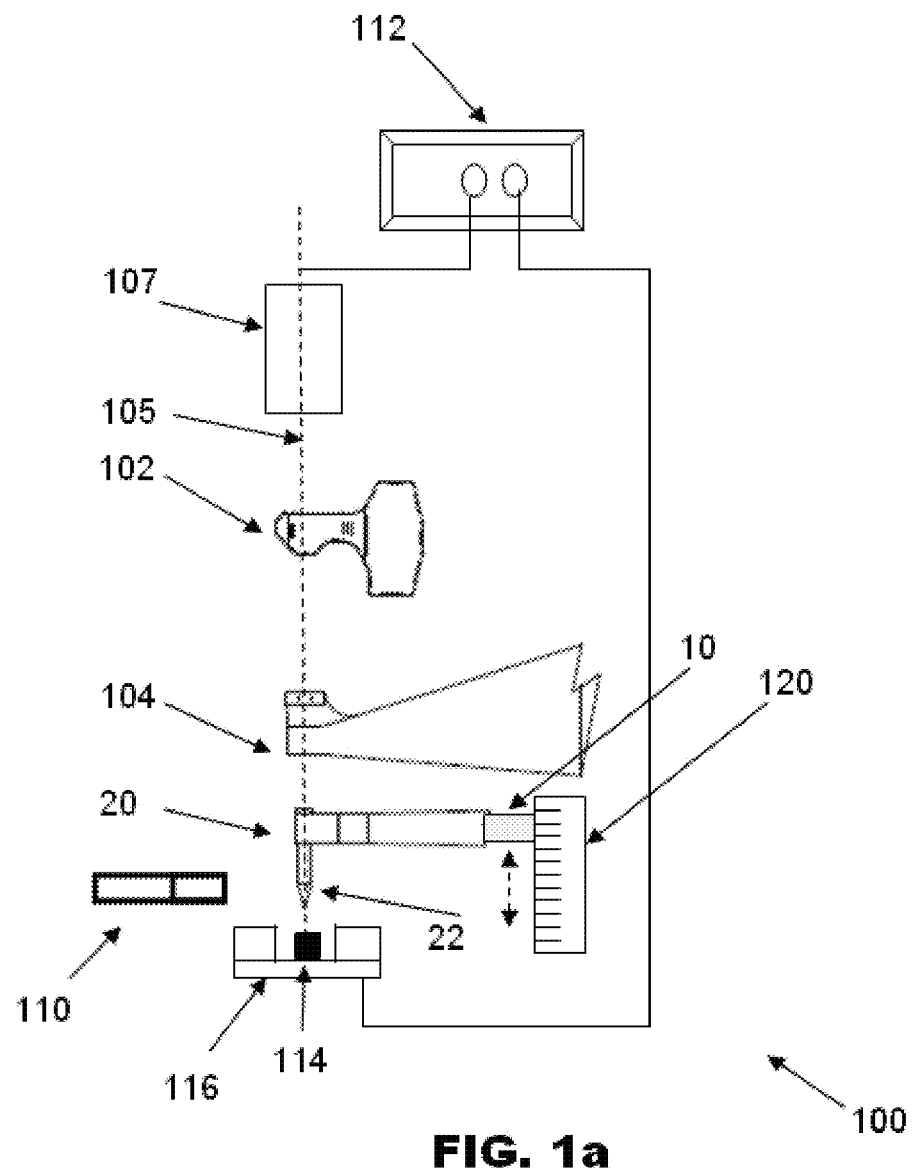

FIG. 1a shows a wire bonder 100 for wire bonding. The wire bonder 100 comprises: i) an upper clamp 102 and a lower clamp 104 for controlling the movement of a bonding wire 105 that is fed from a wire spool (not shown) along a wire-feeding path using a pneumatic device (shown as an air tensioner 107); ii) a transducer 20 for producing ultrasonic vibrations during wire bonding; iii) a bonding tool (shown as a capillary 22) through which the bonding wire 105 is fed during wire bonding; iv) an electronic flame-off (EFO) torch 110 for generating an electrical discharge to create a free air ball at a tail end of the bonding wire 105; v) a contact sensor 112 responsive to contact between objects; and vi) a measuring device (shown in FIG. 1 as a position encoder 10) movable relative to a linear scale 120 to determine and measure a position of the capillary 22 with respect to a reference position.

A wire bonding process of the wire bonder 100 will now be described with reference to FIG. 1a. First, the wire bonder 100 forms a first wire bond—in particular, a ball bond wherein a deformation of the free air ball is caused—on a top surface of a semiconductor die 114 arranged on a substrate and, more specifically, on a lead frame 116. Thereafter, the wire bonder 100 forms a second wire bond—in particular, a wedge bond—on a top surface of the lead frame 116 using the bonding wire 105 such that a wire loop connects between the ball bond and the wedge bond. After the wire bonder 100 has performed wedge bonding on the lead frame 116, the capillary 22 is moved in a direction away from the wedge bond such that the base of the capillary 22 is positioned at a predetermined position. It should be noted that before the capillary 22 moves away from the wedge bond, the upper clamp 102 is closed and the lower clamp 104 opened to prevent any tension that might prematurely break the bonding wire 105 from the wedge bond. Once the base of the capillary 22 is positioned at its predetermined position, the lower wire clamp 104 is then closed to exert a gripping force on the bonding wire 105. Thereafter, the capillary 22 is moved further away from the wedge bond upwards along a Z-axis by a tail break height in order to pull the bonding wire 105 away from the wedge bond. This creates a tension that breaks and separates the bonding wire 105 from the wedge bond to form a wire tail of a length substantially similar to a predetermined wire tail length. The wedge bond, however, should remain bonded to the lead frame 116. The wire tail that is formed corresponds to the portion of the bonding wire 105 that protrudes from the base of the capillary 22.

A new machine portability tuning methodology for a wire bonder is introduced which uses a measuring device to measure the free air ball deformation and to find a correlation between the extent of a free air ball deformation against one or more operating parameters of the wire bonder, such as the ultrasonic current/energy, bonding force settings, bond head deformation settings and/or XY table preset vibration amplitude settings, as delivered by the wire bonder 100 during wire bonding. After deriving a correlation curve, a processor of the wire bonder will compare it against a predefined master curve and calibrate the wire bonder by auto-compensating the difference between the derived correlation curve and the master curve. Hence, different wire bonders can be calibrated to have the same performance as defined by the master curve.

Figure 1B:
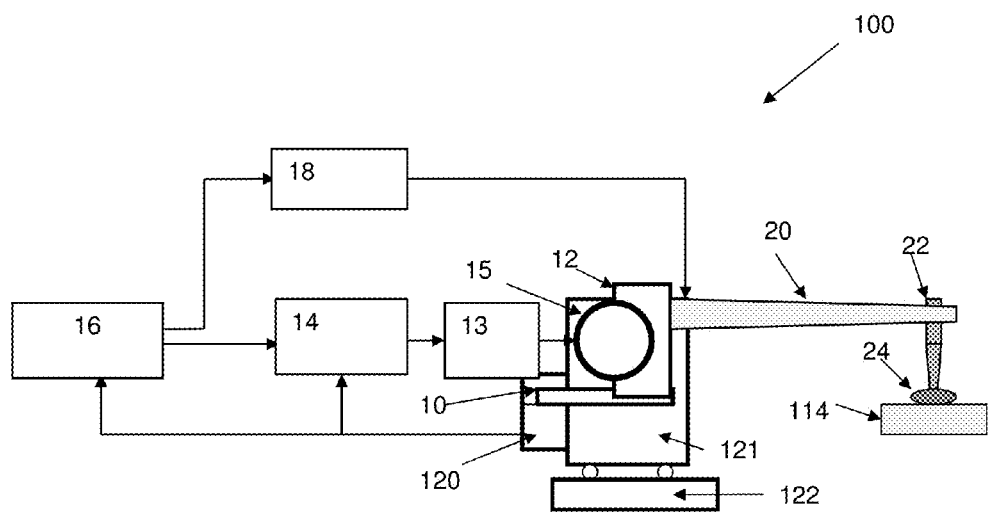

FIG. 1b shows a schematic arrangement of the wire bonder 100 as depicted in FIG. 1a. As shown in FIG. 1b, the position encoder 10 is coupled to a bond head 12 to measure the bond head position and the extent of free air ball deformation when ultrasonic energy is applied by an ultrasonic driver 18 to the transducer 20. During auto-tuning, only ultrasonic current is varied while other factors are fixed. The position encoder 10 preferably has a measurement resolution of at least 0.1 microns. In particular, the position encoder 10 is configured to measure the deformation of the free air ball to the semiconductor die along a vertical Z-axis following the application of the ultrasonic energy, the bond pressure, motion of the bond head 12, and/or vibration of an XY table 121 to which the bond head 12 is coupled.

Referring to FIG. 1b, the bond head controller 14 controls a motor driver 13 and motor 15 to move the bond head 12 and the capillary 22, which thereby applies a constant pressure on a free air ball 24. On the other hand, the ultrasonic driver 18 controls the transducer 20 to apply the ultrasonic energy to the free air ball 24. The free air ball 24 will be deformed accordingly by the combination of the ultrasonic energy and the bond pressure acting thereon. The bond head encoder 10 will measure the extent of deformation of the free air ball 24 and feed the results back to the central computer 16.

The measurement of the free air ball deformation using the position encoder 10 and the linear scale 120 will now be described in detail.

First, the bond head controller 14 moves the bond head 12 towards a conductive pad on the semiconductor die 114, until the base of the free air ball contacts the conductive pad on the semiconductor die 114. Since the contact sensor 112 is electrically connected between the free air ball 24 and the conductive pad on the semiconductor die 114, an electrical circuit is accordingly formed by such an arrangement—that is, a closed electrical circuit is formed when the base of the free air ball 24 contacts the conductive pad on the semiconductor die 114. Thus, the contact sensor 112 is responsive to contact between the base of the free air ball 24 and the conductive pad on the semiconductor die 114. Alternatively, signal changes to a bond head may also be used to determine the point at which the base of free air ball 24 contacts the conductive pad of the semiconductor die 114.

After the free air ball contact, the capillary 22 is successively lowered towards the conductive pad on the semiconductor die 114, the linear scale 120 measures the distance as moved by the capillary 22 until the free air ball 24 is fully deformed by the capillary 22. Thus, the encoder 10 and the linear scale 120 are capable of measuring a Z-level (or height) of the free air ball deformation as caused by ultrasonic energy—or any other parts of the wire bonder 100 that cause motion of the capillary 22 (eg. the vibratory motion of the XY table 121 or the corresponding motion of the bond head 12 to provide a bonding force).

Figure 2:
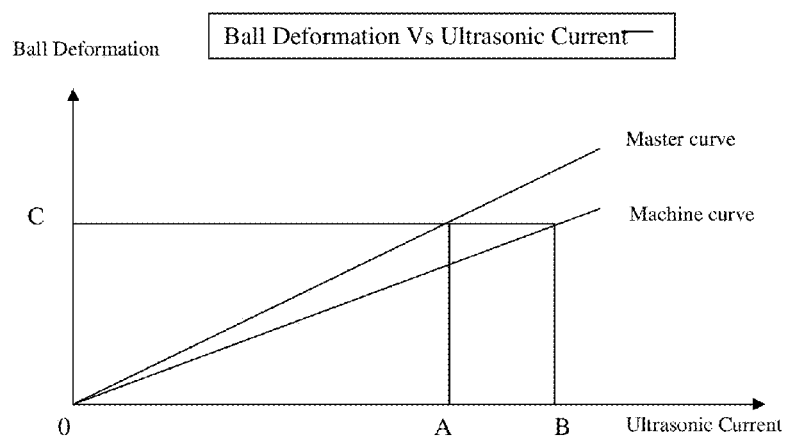
FIG. 2 shows different correlations between an operating parameter of an ultrasonic current and the amount of a free air ball deformation.

Accordingly, a ball bond is formed by the wire bonder 100 on the conductive pad of the semiconductor die 114, wherein a deformation of the free air ball 24 is caused. The position of the capillary 22 along the Z-axis is then measured by the position encoder 10 immediately after the ball bond is formed. By comparing the position of the capillary 22 measured immediately after the ball bond is formed against the position of the capillary 22 when the base of the free air ball 24 just contacts the conductive pad on the semiconductor die 114, the amount of ball deformation of the free air ball 24 can be measured. As shown in FIG. 2, the central computer 16 collects a set of data relating to a correlation between ultrasonic current delivered from the bond head 12 and the amount of free air ball deformation. Other parameters/settings are kept fixed. Specifically, the central computer 16 instructs the ultrasonic driver 18 to provide different magnitudes of the ultrasonic current (for example, 100 mA, 600 mA and 700 mA) to the transducer 20 and the position encoder 10 then accordingly measures the extent of free air ball deformation. For example, FIG. 2 shows that an ultrasonic current of 700 mA (shown as B) applied to the transducer 20 results in 20 microns of free air ball deformation (shown as C). In this way, a relationship between the ultrasonic current as delivered from the bond head 12 and the extent of a free air ball deformation can be derived.

Further, a master curve based on a fundamental study will be preset as a reference/master curve, which is stored in the central computer 16. Likewise, the master curve relates to an empirical correlation between a desired amount of free air ball deformation and the typical ultrasonic current for achieving the same. For example, FIG. 2 shows that a 20-micron ball deformation (shown as C) is typically achieved by an ultrasonic current of 600 mA (shown as A) from the master curve, instead of the higher ultrasonic current of 700 mA (shown as B) from the machine curve. Therefore, the 20-micron free air ball deformation achieved by the application of an ultrasonic current of 700 mA might not be accurate or repeatable. This can be explained by the fact that the amount of free air ball deformation depends not just on the ultrasonic current applied to the transducer (20), but also other factors such as the magnitude of ultrasonic current, the type of tooling, the extent of material variation and the extent of tuning accuracy.

By comparing the derived machine curve with the master curve, a fixed conversion factor of $1-(B-A)/A$ (or $1-(700-600)/600=0.833$) can be defined and auto-set in the central computer 16 of the wire bonder, such that the ultrasonic current applied by the ultrasonic driver 18 to the transducer 20 is calibrated by the conversion factor (eg. 0.833). By relying on the master curve, calibration of the wire bonder is scalable across different machines.

Figure 3:
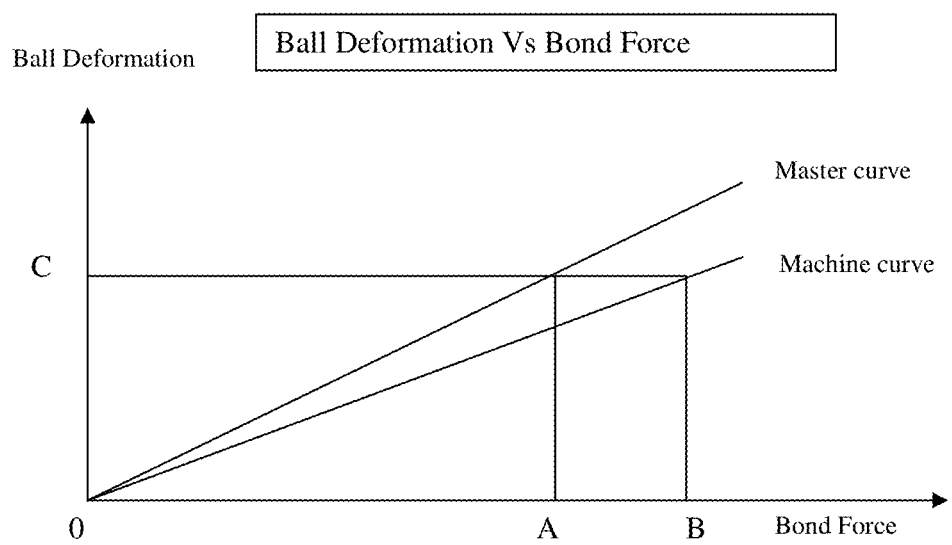
FIG. 3 shows different correlations between an operating parameter of a bond force and the amount of a free air ball deformation.

Similarly, the relationship of the free air ball deformation against the bond force can also be defined. As shown in FIG. 3, the central computer 16 first collects a set of data relating to a correlation between different bond forces delivered from the bond head 12 and the amount of free air ball deformation, whilst other settings are kept fixed. Specifically, the central computer 16 instructs a motor driver 13 to move the bond head 12 and thereby create different magnitudes of the bond force (for example, 50 g, 100 g and 150 g) and the bond head encoder 10 then accordingly measures the extent of free air ball deformation. For example, FIG. 3 shows that an applied bond force of 150 g (shown as B) by the bond head 12 results in 25 microns of ball deformation (shown as C). In this way, a relationship between the different bond forces as delivered from the bond head 12 and the extent of free air ball deformation is derived.

A master curve relating to an empirical correlation between a desired extent of free air ball deformation and the typical bond force for achieving the same can be preset as a reference/master curve, which is stored in the central computer 16. For example, FIG. 3 shows that a 25-micron free air ball deformation (shown as C) is typically achieved by a bond force of 120 g (shown as A) from the master curve, instead of the higher bond force of 150 g (shown as B) from the machine curve. Therefore, the 25-micron free air ball deformation achieved by the application of a bond force of 150 g might not be accurate or repeatable. This can be explained by the fact that the amount of free air ball deformation depends not just on the bond force applied by the bond head 12, but also such other factors such as the magnitude of ultrasonic current, the type of tooling, the extent of material variation and the extent of tuning accuracy.

By comparing the derived machine curve with the master curve, a fixed conversion factor of $1-(B-A)/A$ can again be defined and auto-set in the central computer 16 of the wire bonder 100, such that the bond force applied by the bond head 12 is calibrated by the conversion factor. By relying on the master curve, calibration of the wire bonder 100 is scalable across different machines.

Figure 4:
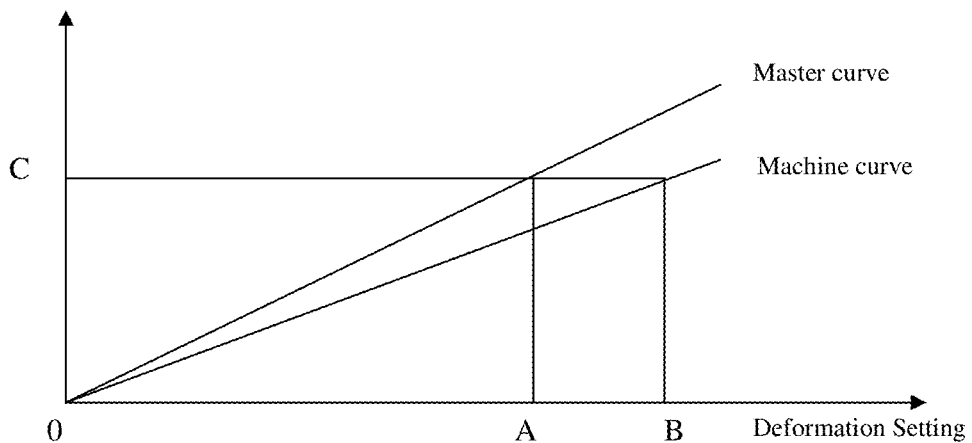
FIG. 4 shows different correlations between an operating parameter of a deformation setting and the amount of a free air ball deformation.

As shown in FIG. 4, the central computer 16 collects a set of data relating to a correlation between different deformation settings and the amount of free air ball deformation. Other settings are kept fixed. Each of the deformation settings comprises a specific combination of an ultrasonic current applied to the transducer 20 and a bond force applied by the bond head 12. The machine curve shown in FIG. 4 is derived by the following deformation settings: i) ultrasonic current: 100 mA; bond force: 5 g; ii) ultrasonic current: 150 mA; bond force: 10 g; iii) ultrasonic current: 200 mA; bond force: 15 g; iv) ultrasonic current: 300 mA; bond force: 20 g. For example, FIG. 4 shows that the deformation setting iv) (shown as B) results in 20 microns of free air ball deformation (shown as C). In this way, a relationship between different bond settings of the wire bonder 100 and the extent of free air ball deformation is derived.

Again, a master curve relating to an empirical correlation between a desired free air ball deformation and a typical deformation setting for achieving the same can be preset as a reference/master curve, which is stored in the central computer (16). For example, FIG. 4 shows that a 20-micron free air ball deformation (shown as C) is typically achieved by the bond setting iii) (shown as A) from the master curve, instead of the bond setting iv) (shown as B) from the machine curve. Therefore, the 20-micron free air ball deformation achieved by the application of the bond setting (iv) might not be accurate or repeatable. This can be explained by the fact that the amount of free air ball deformation depends on other factors such as the type of tooling, the extent of material variation and the extent of tuning accuracy.

By comparing the derived machine curve with the master curve, a conversion factor of $1-(B-A)/A$ can again be defined and auto-set in the central computer 16 of the wire bonder 100, such that the bond force applied by the bond head 12 is calibrated by the conversion factor. By relying on the master curve, calibration of the wire bonder 100 is scalable across different machines.

Figure 5:
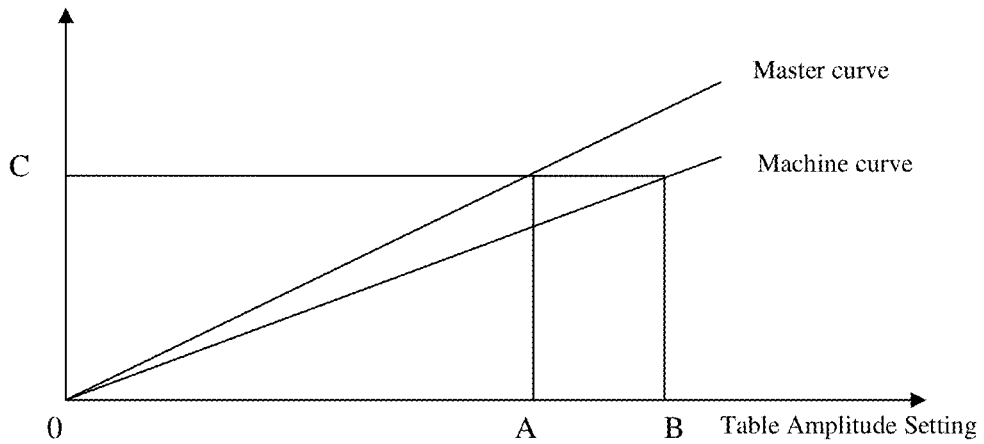
FIG. 5 shows different correlations between an operating parameter of a XY table vibration setting and the amount of a free air ball deformation.

Similarly, the relationship of the free air ball deformation against the XY table vibration settings can also be defined. As shown in FIG. 5, the central computer 16 first collects a set of data relating to a correlation between different vibration amplitude settings as delivered from the XY table 121 and the amount of free air ball deformation, whilst other settings are kept fixed. Specifically, the central computer 16 instructs a motor driver 13 to move the XY table 121 to thereby create different magnitudes of the vibration amplitude (for example, 1 um, 5 um and 10 um) and the bond head encoder 10 then accordingly measures the extent of free air ball deformation. For example, FIG. 5 shows that an applied amplitude of 10 um (shown as B) by the bond head 12 results in 20 microns of ball deformation (shown as C). In this way, a relationship between the different vibration amplitude as delivered from the XY table 121 and the extent of free air ball deformation is derived.

A master curve relating to an empirical correlation between a desired extent of free air ball deformation and the typical amplitude for achieving the same can be preset as a reference/master curve, which is stored in the central computer 16. For example, FIG. 5 shows that a 20-micron free air ball deformation (shown as C) is typically achieved by a vibration amplitude of 10 um (shown as A) from the master curve, instead of the higher amplitude of 15 um (shown as B) from the machine curve.

By comparing the derived machine curve with the master curve, a fixed conversion factor of $1-(B-A)/A$ can again be defined and auto-set in the central computer 16 of the wire bonder 100, such that the amplitude applied by the XY table 121 is calibrated by the conversion factor. By relying on the master curve, calibration of the wire bonder 100 is scalable across different machines.

The proposed method has the following advantages:

1) The test simulates the actual bonding conditions and reduces the variation of the results due to other factors. In contrast, the use of the external laser/optical vibrometer in conventional calibration methods only measures the transducer vibration amplitude. By measuring the extent of ball deformation relative to the ultrasonic current/energy and/or the bond force/pressure of the wire bonder in actual operation, the proposed method directly measures from the bonding results of the wire bonder and, advantageously, the bonding accuracy can be improved.

2) As the proposed method relies on the bond head encoder and the central computer, both of which are built in the wire bonder, no extra equipment is needed to achieve auto-measuring and fine-tuning. This thereby improves user-friendliness. Moreover, the testing time and costs are also saved.

3) A free air ball deformation rate (deformation speed) can be also measured and calibrated.

It should be appreciated that other embodiments of the invention may also fall within the scope of the invention as claimed.

The invention claimed is:

1. A wire bonder comprising:
a processor;
a bond head coupled to the processor, the processor being operative to control motion of the bond head;
a bonding tool mounted to the bond head, the bonding tool being operative to be driven by the bond head to form an electrical interconnection between a semiconductor die and a substrate to which the semiconductor die is mounted using a bonding wire;
a scale;
a measuring device coupled to the bond head, the measuring device being operative to measure a deformation of a bonding portion of the bonding wire as the bonding tool is driven by the bond head to connect the bonding wire to the semiconductor die via the bonding portion, wherein the measuring device is movable relative to the scale for the measuring device to measure the position of the bond head and the extent of the deformation of the bonding portion and the measured deformation of the bonding portion is measured by comparing the position of the bonding tool when the bonding portion just contacts the semiconductor die to the position of the bonding tool at which the deformation of the bonding portion is measured; and
the wire bonder further comprises a contact sensor which is electrically connected between the bonding portion and the semiconductor die, the contact sensor sensing when the bonding portion just contacts the semiconductor die by the formation of a closed electrical circuit including the bonding portion, the semiconductor die, and the contact sensor;
wherein the processor is further operative to
derive at least one correlation between the measured deformation of the bonding portion and an operating parameter of the wire bonder;
compare the at least one derived correlation to a predetermined correlation between the operating parameter of the wire bonder and a desired deformation of the bonding portion; and
calibrate the operating parameter of the wire bonder based on the comparison between the at least one derived correlation and the predetermined correlation of the deformation of the bonding portion against the operating parameter of the wire bonder.

2. The wire bonder of claim 1, wherein the processor is configured to calculate a conversion factor in order to calibrate the operating parameter of the wire bonder.

3. The wire bonder of claim 1, wherein the operating parameter of the wire bonder is an ultrasonic current delivered from the bond head to form the electrical interconnection between the semiconductor die and the substrate.

4. The wire bonder of claim 1, wherein the operating parameter of the wire bonder is a bond force delivered from the bond head to form the electrical interconnection between the semiconductor die and the substrate.

5. The wire bonder of claim 1, wherein the operating parameter of the wire bonder is a deformation setting of the bonding portion.

6. The wire bonder of claim 5, wherein the deformation setting comprises a combination of an ultrasonic current and a bond force, both of which are operatively delivered from the bond head to form the electrical interconnection between the semiconductor die and the substrate.

7. A wire bonder comprising:
a processor;
a bond head coupled to the processor, the processor being configured to control motion of the bond head;
a bonding tool mounted to the bond head, the bonding tool being drivable by the bond head to form an electrical interconnection between a semiconductor die and a substrate to which the semiconductor die is mounted using a bonding wire; and
a measuring device coupled to the bond head, the measuring device being operable to measure a deformation of a bonding portion of the bonding wire as the bonding tool is driven by the bond head to connect the bonding wire to the semiconductor die via the bonding portion,
wherein the processor is configured to
derive at least one correlation between the measured deformation of the bonding portion and an operating parameter of the wire bonder;
compare the at least one derived correlation to a predetermined correlation between the operating parameter of the wire bonder and a desired deformation of the bonding portion; and
calibrate the operating parameter of the wire bonder based on the comparison between the at least one derived correlation and the predetermined correlation of the deformation of the bonding portion against the operating parameter of the wire bonder,
wherein the operating parameter of the wire bonder is a vibratory setting of an XY table of the wire bonder.

8. The wire bonder of claim 1, wherein the measuring device is a position encoder.

9. The wire bonder of claim 8, wherein the position encoder is configured to measure the deformation of the bonding portion along a vertical axis.

* * * * *